(12) United States Patent
Lenthall et al.

(10) Patent No.: US 6,309,806 B1
(45) Date of Patent: *Oct. 30, 2001

(54) METHOD OF PROVIDING MICROSCOPIC FEATURES

(75) Inventors: John Stanley Lenthall; Martin Marples, both of Chesterfield (GB)

(73) Assignee: GKN Sheepbridge Stokes Limited, Chesterfield (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,418

(22) Filed: Jun. 26, 1998

(30) Foreign Application Priority Data

Jul. 3, 1997 (GB) .................................. 9714043

(51) Int. Cl.$^7$ ................................ G03F 7/18; G03F 7/24
(52) U.S. Cl. .................... 430/323; 430/320; 427/239; 216/8; 123/668
(58) Field of Search ..................... 430/323, 318, 430/320; 427/239; 123/196, 668; 216/8

(56) References Cited

U.S. PATENT DOCUMENTS

| | | | |
|---|---|---|---|
| 2,968,555 | 1/1961 | Bendler et al. | 430/323 |
| 3,645,178 | * 2/1972 | Speicher | 95/1 |
| 3,889,696 | * 6/1975 | Ousterling | 134/57 |
| 4,049,413 | 9/1977 | French | 65/3 |
| 4,678,738 | * 7/1987 | Shimizu | 430/320 |
| 5,395,718 | 3/1995 | Jensen et al. | 430/5 |
| 5,549,086 | * 8/1996 | Ozawa | 123/193.6 |

FOREIGN PATENT DOCUMENTS

| | | |
|---|---|---|
| 0 264 341 | 4/1988 | (EP) . |
| 0 557 998 A2 | 9/1993 | (EP) . |
| 0 762 721 A1 | 3/1997 | (EP) . |
| 2278563 | 7/1994 | (GB) . |
| 90/06234 | * 6/1990 | (WO) . |

OTHER PUBLICATIONS

EPO International Search Report Application No. EP 98 11 1892 dated Oct. 15, 1998.
Patent Abstracts of Japan, Publication No. 60047846 "Manufacture of Cylinder of Engine", Publication date Mar. 15, 1985.

* cited by examiner

*Primary Examiner*—Mark F. Huff
*Assistant Examiner*—Nicole Barreca
(74) *Attorney, Agent, or Firm*—Marshall, Gerstein & Borun

(57) ABSTRACT

A method of providing the inside surface of a hollow object with at least one microscopic feature, comprising the steps of coating at least a part of the inside surface with photo-sensitive material, directing light onto the material to photo-expose a selected portion of the material, removing the exposed selected portion or the unexposed material thereby to leave an opening through the coating, applying an etching substance to etch the inside surface through the opening to form a microscopic feature in the inside surface, characterized in that the light which is directed onto the photo-sensitive material comprises a collimated beam and during exposure, the beam and the inside surface are relatively moved so that the beam impinges upon the selected portion of the photo-sensitive coating to be exposed.

16 Claims, 2 Drawing Sheets

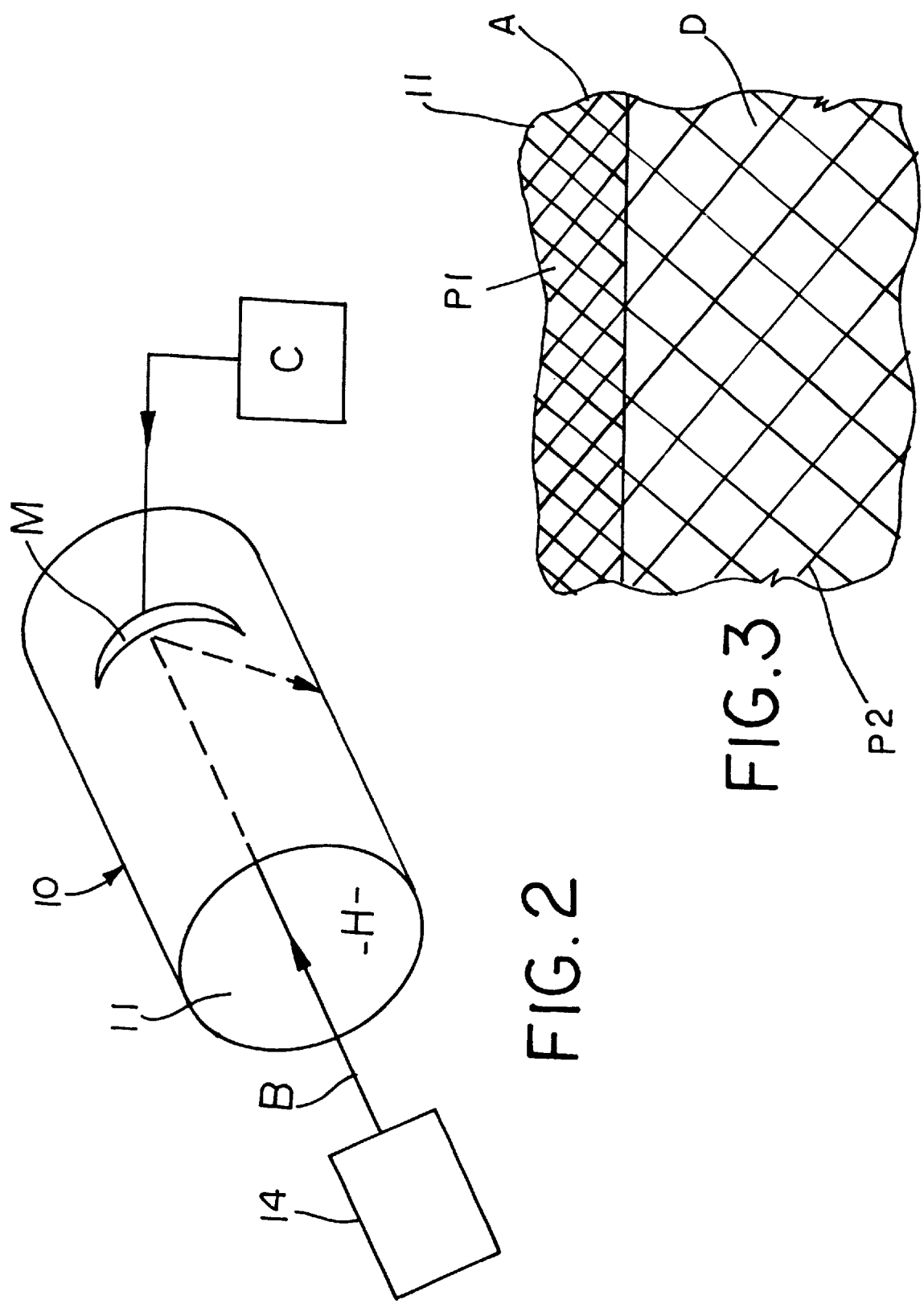

METHOD OF PROVIDING MICROSCOPIC FEATURES

BACKGROUND TO THE INVENTION

This invention relates to a method of providing the inside surface of a hollow object with at least one microscopic feature such as a valley or pit. More particularly but not exclusively the invention relates to a method of providing a microscopic feature for the retention of lubricant, in the inside surface of a cylinder lining in which a piston operates.

Description of the Prior Art

Conventionally the inside surfaces of cylinder liners are honed by a mechanical honing tool to a specified roughness to provide microscopic features in the form of valleys, which in use retain oil.

Most commonly, such features have been provided by a mechanical tool comprising a plurality of diamond or other cutting elements and the tool being rotated in the hollow of the liner to cut the features in the honed inside surface. However although such diamond cutting tools are not expensive per boring operation, they usually require to be mounted on a machine head which is capable of movement about multiple axes, which is expensive. Also, with such a mechanical technique, one can achieve only limited control over the distribution and depth of features formed in the honed inside surface, and it is not convenient to provide any variation in the nature of microscopic features along the cylinder liner, as is desirable, so that those portions of the liner which are most prone to wear, can be lubricated more than less wear-prone portions.

Another proposal, e.g. as described in UK patent application 2278563 has involved the use of a laser beam which is manipulated to cut a predetermined pattern of features into the honed inside surface of the liner, but a very high power laser beam is required which is undesirable and the extent to which the beam can be conveniently manipulated is restricted. Also, because using such a method, the metal of the liner is essentially melted to provide the microscopic features, microscopic burs and regions of hard carbide tend to be formed at the edges and/or bases of the features which are undesirable as they may interfere with the efficiency of the features to retain a desired amount of lubricant. Loosely attached hard carbide can form abrasive particles that may damage an engine and a build up of material at the edges of the lubricant channels has to be removed by an additional mechanical honing stage after the laser "structuring" stage.

It has also been proposed, e.g. in U.S. Pat. No. 2,968,555 to provide microscopic features by chemical etching. The inside surface of the cylinder liner is coated with a photo-sensitive coating which is exposed to light through a mask and then the coating is developed to remove the exposed portions and leave openings therethrough. Etching substance is applied to etch the inside surface of the liner through the openings. Although such a method enables close control of the depths of the microscopic features, there is a problem in that it is necessary to insert a mask into the hollow of the liner and apply it to the coated inside surface of the liner. If one winds a mask into position in a helical form, it is difficult to join the edges of the mask to provide continuity along the liner, and thus it is difficult consistently to achieve a preselected pattern of microscopic features.

SUMMARY OF THE INVENTION

According to one aspect of the invention we provide a method of providing the inside surface of a hollow object with at least one microscopic feature comprising the steps of coating at least a part of the inside surface with photo-sensitive material, directing light onto the material to photo-expose a selected portion of the material, removing the exposed selected portion or the unexposed material thereby to leave an opening through the coating, applying an etching substance to etch the inside surface through the opening to form a microscopic feature in the inside surface, characterised in that the light which is directed onto the photo-sensitive material comprises a collimated beam and during exposure, the beam and the inside surface are relatively moved so that the beam impinges upon the selected portion of the photo-sensitive coating to be exposed.

Thus by utilising a method according to the invention it is possible to achieve consistently the provision of one or a pattern of microscopic features in the inside surface of e.g. a cylinder liner. By controlling the relative movement between the light beam and the inside surface during exposure an opening or openings may be provided in any desired position in the coating and to any desired pattern. Hence, the topography, of the microscopic feature or features formed during etching can accurately be controlled. Because the microscopic features are written on to the photo-sensitive material directly by the light beam, there is no need to insert a mask in the hollow through which the photo-sensitive material needs to be exposed.

Preferably the collimated beam is of laser light of a wavelength to which the photo-sensitive coating is sensitive, but unlike the prior art method described above which utilises a laser, the laser used to provide the light beam may be of low power.

With a suitable photo-sensitive material, possibly the low power laser light may itself remove selected portions of the photo-sensitive coating. Preferably though, subsequent to exposure, the coating is chemically treated, e.g. by dipping the object in a bath of the treating chemical, to remove the exposed portion of the coating or the unexposed coating, depending on the nature of the photo-sensitive coating. It will be appreciated that the photo-sensitive coating may be of the kind which is changed on exposure to light of a particular wavelength such that it may subsequently be chemically removed by developing, or the coating material may be of the kind which is changed on exposure to light of a particular wavelength such as to make it inert to a chemical which may be used to remove the unexposed photo-sensitive material.

The beam of laser or other light may conveniently be manipulated, e.g. by means of one or more mirrors at least one of which may be located in the hollow, relative to the inside surface, and in this way, the collimated beam may be directed to follow a predetermined path across the inside surface during exposure, thus to enable a predetermined pattern or patterns of openings to be provided through the photo-sensitive material, either when the exposed portions or unexposed material is removed, and hence so that a predetermined pattern or patterns of microscopic features may be provided in the inside surface during etching.

If desired, the pattern of microscopic features may be varied over the inside surface so as to provide a greater density or different pattern of microscopic features over one region of the inside surface when compared with another region of the inside surface.

Thus particularly in a cylinder lining, at the position where in use, a piston ring turns over as the direction of reciprocation of the piston in the liner is reversed, a greater density or different design of microscopic features may be provided to enable greater lubrication at that position.

The method of the invention may be preformed in conjunction with a conventional honing technique whereby prior to coating the inside surface, the inside surface may be honed to a roughness of for example, less that 2 µm preferably of about 1 µm maximum peak to valley height.

The coating of photo-sensitive material may be applied to the inside surface of the object by any desired means. However most conveniently the inside surface is coated by dipping the object in a bath of photo-sensitive material or by spraying.

The etching substance may be applied by dipping the object in a bath of etching substance from which the object is removed from after a predetermined time, and the etching substance may be removed or neutralised e.g. by washing after a predetermined period of time, so as to control the depth of the microscopic feature (or features) formed in the inside surface of the object. Alternatively the etching substance may be applied by spraying the object with etching substance for a predetermined time.

Thus no additional honing stages are required after the invention has been performed.

BRIEF DESCRIPTION OF THE DRAWINGS

The invention will now be described with reference to the accompanying drawings in which:

FIG. 2 is an enlarged illustrative view showing one stage in the method; and

FIG. 3 is an enlarged illustrative view of the inside surface of part of a cylinder liner in which microscopic features have been formed by method according to the invention.

DESCRIPTION OF THE PREFERRED EMBODIMENTS

Figure 1:
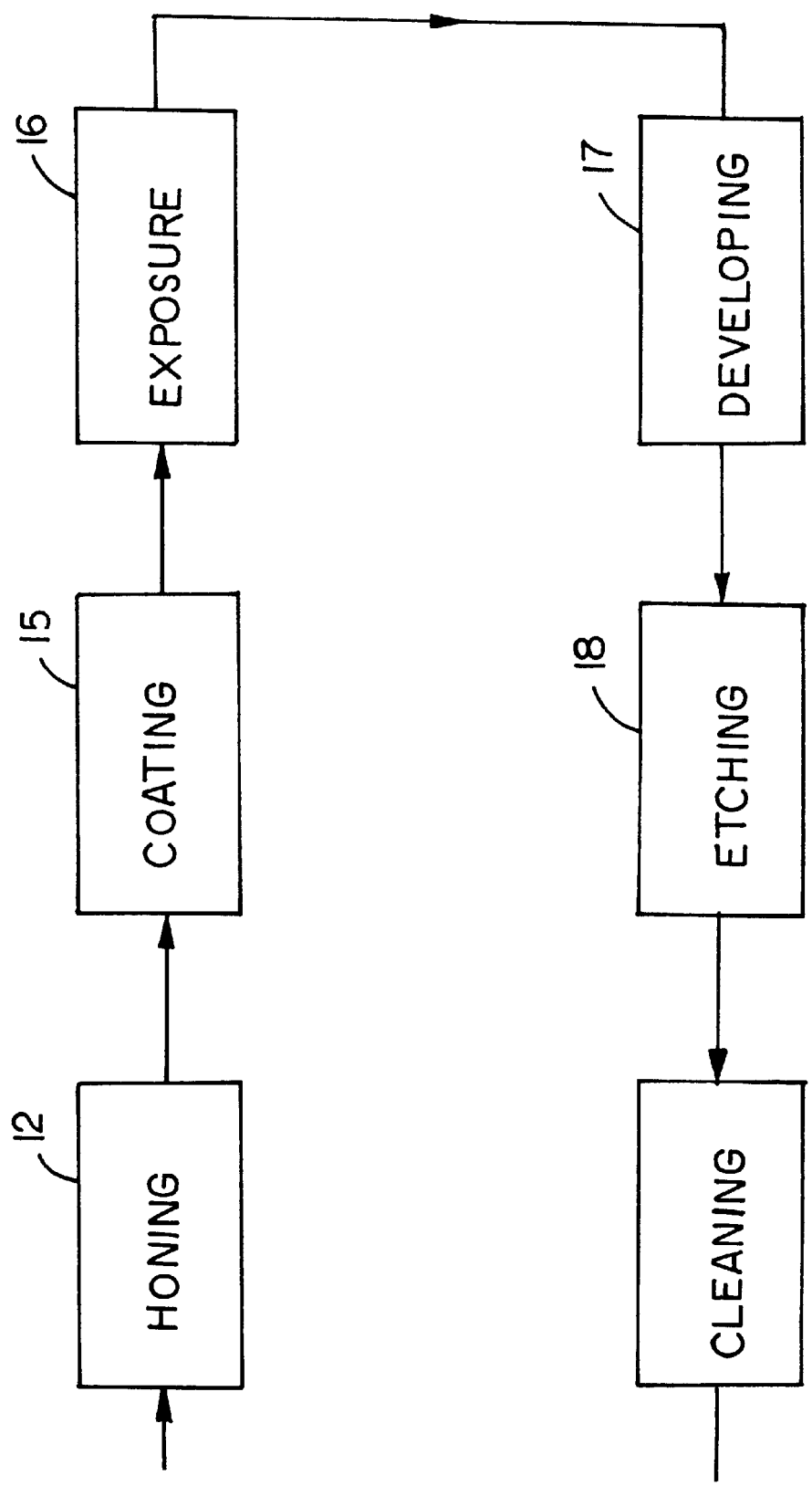
FIG. 1 is a schematic diagram indicating method steps which may be performed in accordance with the invention.

Referring to the drawings, a hollow object comprises in this example a cylinder liner 10 which is generally cylindrical, and has a generally cylindrical inside surface 11.

The method of the invention provides the inside surface 11 with at least one microscopic feature for retaining oil. In FIG. 3, examples of features P1 and P2 are indicated comprising a pattern of microscopic valleys or channels. In use, the features P1 and P2 retain oil or other lubricant as a piston reciprocates in a hollow H of the cylinder liner 10.

In a preliminary step, the inside surface 11 of the liner 10 is honed at a honing station 12 using a conventional mechanical honing tool, which may have diamond cutting heads or the like. Preferably the inside surface 11 is honed to a roughness preferably of about 1 µm to 2 µm maximum peak to valley height and thus the diamond or other abrasive particles used in the cutting head are themselves microscopic.

When the inside surface 11 is honed to a desired roughness, the liner 10 is coated at a coating station 15 with photo-sensitive material. Such coating may conveniently be achieved by dipping the cylinder liner 10 into a bath of the photo-sensitive material. Alternatively the coating may be sprayed on or otherwise applied. In this example, the photo-sensitive material is a photo-resistive material comprising a solvent containing a suspension of polymeric particles, such as polyisoprene. Commercially available such photo-resist material is sensitive to wavelengths of light within a generally narrow band of wavelengths and thus the material is preferably insensitive to ambient light in the manufacturing environment.

The material is preferably a positive photo-resist which softens on exposure to light of the appropriate wavelength which facilitates removal of the exposed material during a subsequent chemical developing process. Preferably the coating is applied to a thickness of about 2 µm, but could be applied to a thickness of anywhere between 1 and 5 µm. Control of the thickness of the coating may be achieved by controlling the dwell time of the object 10 in the bath of the coating and/or the viscosity of the coating material.

When the photo-sensitive coating has stabilised which may be achieved by natural or forced drying or by baking, the cylinder liner 10 is positioned at an exposing station 16 where the coating is exposed to laser light in the wavelength to which the photo-sensitive material is sensitive.

Only a low power laser, as indicated at 14 in FIG. 2, is required and alternatively, any other means of achieving a collimated beam of light of the wavelength required, may be utilised.

The direction of the beam B is manipulated by one or more mirrors M, at least one of which may be located within the hollow H of the liner 10. Movement of the mirror M (or mirrors) may be controlled by a control means C (e.g. a computer control means) so that the beam B, where it impinges upon the coated inside surface 11 of the liner 10, is directed to follow a predetermined path across the inside surface 11 during exposure, thus to achieve a predetermined pattern or patterns of exposed portions of the photo-sensitive material.

In an alternative arrangement, the laser beam may be stationary and the component moved in a controlled manner so that the beam follows a predetermined path across the internal surface of the component.

One suitable laser 14 is an ultra violet "HeCd" which produces a beam focused to between 5 and 8 µm diameter, although preferably a bigger beam, of between 15 and 25 µm is used, as it is desired to expose the photo-sensitive material to a width of between 20 and 40 µm. Essentially, lines are "written" into the photo-resistant material where it is desired to provide microscopic features P1, P2.

The predetermined path of the beam B may comprise a single path which may cross over itself many times such that a single microscopic line is "written" into the photo-sensitive material. Alternatively, the beam B may not be continuous but may for example be intermittent, such that a plurality of individual microscopic features P1, P2 are provided.

The mirror M may be mounted for example on a mobile arm and moved by means of one or more suitable actuators (not shown) under the control of the control means C. In another arrangement though, relative movement between the beam B and the inside surface 11 of the liner 10 or other object may otherwise be achieved. For example, the liner 10 may be rotated and/or traversed, so that the beam B impinges upon the inside surface 11 during exposure to enable one or more selected portions of the coating to be exposed. Of course, both the beam B and the object 10 could be moved if desired.

After exposure, the photo-sensitive coating is developed at a developing station 17. The softened photo-resist material is chemically removed to leave openings through the coating, corresponding to the positions where microscopic features P1, P2 are to be foamed. The developer may be at an elevated temperature and the object 10 may be agitated in a bath of developer if necessary. Alternatively, the developer could be sprayed on.

When all of the exposed portions of the coating are removed, the object 10 may then be presented at an etching station 18 which may again be a bath, but of etching substance such as ferric chloride. It will be appreciated that during the developing stage 17, when the exposed portions of the coating are removed, the opening or openings in the coating will enable the etching substance to etch the inside surface 11 of the cylinder liner 10.

The dwell time of the object 10 in the bath of etching substance may carefully be controlled so that the depth of the microscopic features P1, P2 formed, may carefully be controlled. Preferably the features are formed to a depth of between 3 and 15 $\mu$m.

The etching effect may be stopped by removing the object 10 from the bath of etching substance and washing the object 10 e.g. by spraying water or a suitable neutralising chemical onto the object 10.

Finally, the remaining photo-sensitive material is removed from the inside surface 11 of the cylinder liner 10, for example by using a higher power laser beam or more preferably, a solvent such as acetone, methylated spirit, or a concentrated hydroxide based developing solution.

In another arrangement the chemical etching substance may be applied by spraying e.g. for a predetermined time.

Utilising the present invention, it will be appreciated that the pattern of microscopic features P1, P2 provided in the inside surface 11 of the object 10 may be determined by carefully controlling the predetermined path the laser or other beam B follows over the coating during the exposure process. Thus in accordance with the invention it is possible simply and straightforwardly to arrange for there to be a greater density/alternative pattern of microscopic features at one position of the inside surface of the cylinder liner 10, compared with another. In FIG. 3 for example, region A is shown which is the so called "turn over" position i.e. the region of the cylinder liner 10 where the piston ring turns over as a piston operating in the cylinder liner 10 reverses its direction of reciprocation. In this region A it is desirable for there to be greater lubrication and hence, by a method in accordance with the invention, a greater density of microscopic features P1 can conveniently be provided in that position.

It is undesirable for there to be such a large density of microscopic features over other regions, such as region D of the cylinder liner 10 where the piston reciprocates because this could lead to unwanted engine emissions and accordingly in region D the density of microscopic features P2 is less than in region A.

The most advantageous pattern or patterns of microscopic features for any particular application can be determined and by controlling the path of the laser or other light beam B during the exposure process, that pattern or patterns of microscopic features can be formed during the etching process.

Various modifications are possible without departing from the scope of the invention.

In the example described, the photo-sensitive material is applied by dipping, and the material is developed by dipping, and the features are etched by dipping although in another arrangement, any of these materials/substances may be applied for example by spraying or by any other suitable means.

In the example described, the photo-sensitive material is a so called positive photo-resist which softens on exposure to a pre-determined wavelength of light. In another example, the coating may comprise a so called negative photoresist material which hardens on exposure to light of a particularly pre-selected wavelength, such that during the developing or other chemical treating process 17, portions of the coating are removed which were unexposed during the exposure process 16. In this event, the laser or other light beam B would mark out on the coating on the inside surface 11 of the cylinder liner 10, not lines corresponding in position to the desired positions of the microscopic features, but the areas between the positions where it is desired to form microscopic features.

Although ferric chloride has been described as a suitable etching substance, any other suitable etching substance, may instead be used.

Although the invention has been described with reference to an object comprising a cylinder liner 10 in which the inside surface 11 is of cylindrical configuration, the invention is more generally applicable to providing one or more microscopic features in the inside surface 11 of any hollow object, but particularly, but not exclusively, a hollow object 10 made of metal, the inside surface 11 of which has been honed to a preselected roughness.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of providing the inside surface of a metal liner for an engine cylinder with at least one oil retaining microscopic feature having a desired depth less than a thickness of the metal liner, including the steps of coating at least a part of the inside surface with photo-sensitive material, directing light onto the material to photo-expose a selected portion of the material, removing the exposed selected portion or the unexposed material thereby to leave an opening through the coating, applying an etching substance to etch the inside surface through the opening to form the microscopic feature in the inside surface having the desired depth between about 3 $\mu$m and about 15 $\mu$m, wherein the light which is directed onto the photo-sensitive material comprises a collimated beam and during exposure the beam and the inside surface are relatively moved so that the beam impinges upon the selected portion of the photo-sensitive coating to be exposed.

2. A method according to claim 1 wherein the collimated beam is of laser light of a wavelength to which the photo-sensitive coating is sensitive.

3. A method according to claim 1 wherein subsequent to exposure, the coating is chemically treated to remove the exposed portion of the coating or the unexposed coating.

4. A method according to claim 3 wherein the coating is chemically treated by dipping the metal liner in a bath of treating chemical or spraying the metal liner with treating chemical.

5. A method according to claim 3 wherein the coating is chemically treated by spraying the object with treating chemical.

6. A method according to claim 1 wherein during exposure, the beam is manipulated relative to the inside surface of the metal liner so that the collimated beam is directed to follow a desired pattern across the inside surface during exposure.

7. A method according to claim 6 wherein the beam is manipulated by means of one or more mirrors at least one of which is located in a hollow of the metal liner.

8. A method according to claim 6 wherein microscopic features are formed on the inside surface during etching, the microscopic features following the desired pattern.

9. A method according to claim 8 wherein the desired pattern of microscopic features is varied over the inside surface so as to provide a first region having a first density of microscopic features and further to provide a second region having a second density of microscopic features, the density of the first region being greater than the density of the second region.

10. A method according to claim 1 wherein prior to coating the inside surface, the inside surface is honed to a maximum peak to valley roughness of less that 2 $\mu$m.

11. A method according to claim 1 wherein the inside surface is coated by dipping the metal liner in a bath of photo-sensitive material.

12. A method according to claim 1 characterised in that the etching substance is removed or neutralised after a predetermined period of time so as to control the depth of the microscopic feature formed in the inside surface of the metal liner.

13. A method according to claim 12 wherein the etching substance is applied by dipping the metal liner in a bath of etching substance from which the metal liner is removed from after a predetermined time, and the etching substance is removed or neutralised by washing.

14. A method according to claim 12 wherein the etching substance is applied by spraying the metal liner with etching substance for a predetermined time.

15. A method of forming microscopic features on the inside surface of a metal engine cylinder liner comprising the steps of:

coating a portion of the inside surface with a photo-sensitive material;

treating portions of the material by directing a collimated beam of light onto the material and moving the inside surface of the cylinder liner and the beam relative to each other so that the selected portion of the material forms a first pattern and further forms a second pattern;

removing the treated portions of the material to thereby reveal portions of the inside surface corresponding to the first and second patterns; and etching the inside surface to thereby form microscopic features the microscopic features having a depth between about 3 $\mu$m and about 15 $\mu$m, the microscopic features following the first pattern and the second pattern, the first pattern having a first density of microscopic features and the second pattern having a second density of microscopic features.

16. A method of forming microscopic features on the inside surface of a liner for the cylinder of an engine comprising the steps of:

coating a portion of the inside surface with a photo-sensitive material;

treating a selected portion of the material by directing a collimated beam of light onto the material;

moving the inside surface and the light beam relative to each other so that the selected portion defines a pattern extending laterally about the inside surface;

removing the selected portion to thereby to leave an opening through the material generally corresponding to the pattern;

etching the inside surface through the opening along the pattern to thereby form a microscopic feature following the pattern on the inside surface, wherein the etching step includes the step of controlling the depth of the microscopic feature to a desired depth between about 3 $\mu$m and about 15 $\mu$m.

* * * * *